United States Patent [19]

Meyer

[11] Patent Number: 4,849,087
[45] Date of Patent: Jul. 18, 1989

[54] APPARATUS FOR OBTAINING TRANSVERSE UNIFORMITY DURING THIN FILM DEPOSITION ON EXTENDED SUBSTRATE

[75] Inventor: Stephen F. Meyer, Los Altos, Calif.
[73] Assignee: Southwall Technologies, Palo Alto, Calif.
[21] Appl. No.: 155,153
[22] Filed: Feb. 11, 1988
[51] Int. Cl.⁴ .................... C23C 14/34; C23C 14/54
[52] U.S. Cl. ............................. 204/298; 204/192.13
[58] Field of Search ................. 204/192.13, 192.12, 204/298, 298 GF, 298 MT, 298 SM, 298 AN

[56] References Cited

U.S. PATENT DOCUMENTS

| | | | |
|---|---|---|---|
| 3,884,787 | 5/1975 | Kuehnle | 204/192.12 |
| 3,976,555 | 8/1976 | Von Hartel | 204/192.14 |
| 4,204,942 | 5/1980 | Chahroudi | 204/298 |
| 4,425,218 | 1/1984 | Robinson | 204/298 |

Primary Examiner—Aaron Weisstuch
Attorney, Agent, or Firm—Irell & Manella

[57] ABSTRACT

Apparatus for sputter depositing a layer of metal onto a laterally extended substrate includes a substrate support, a deposition station, a downstream sensing assembly and a computerized controller. The deposition station includes a cathode and anodes extending the width of the substrate. Gas supply is provided to each of a plurality of zones through a common distribution chamber with a plurality of inlets which in combination cover the width of the substrate on which a thin film layer is to be deposited. The gas flow is directed through each anode into the plasma region and is individually controlled for each zone. The downstream sensing assembly includes, for each zone, a four-point contact assembly usign four electrically conductive wheels. Two of the wheels are used to apply current to the thin film and two are used to sense the resistance of it. This information is fed into the computer for use in controlling the gas flow into the deposition station, by zone.

11 Claims, 7 Drawing Sheets

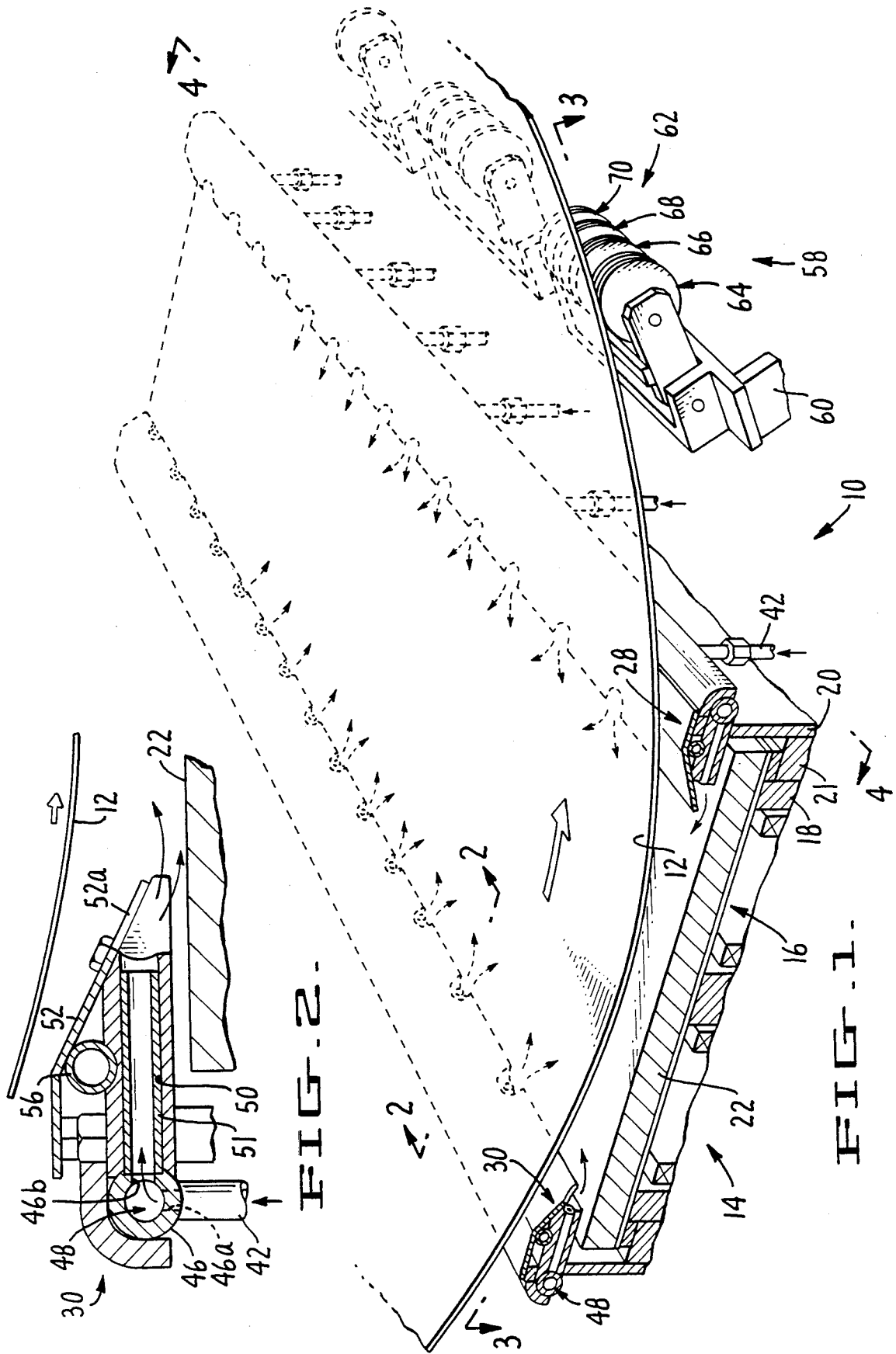

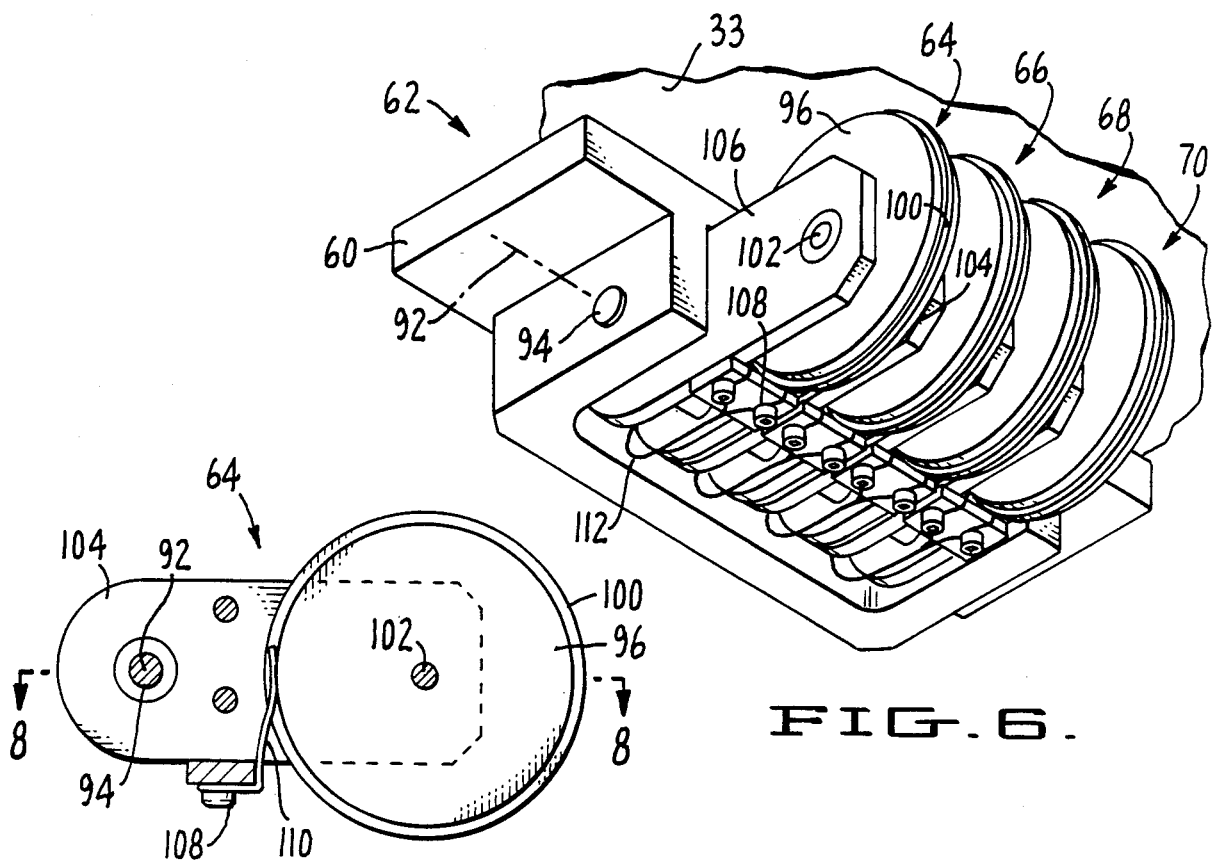
FIG. 6.
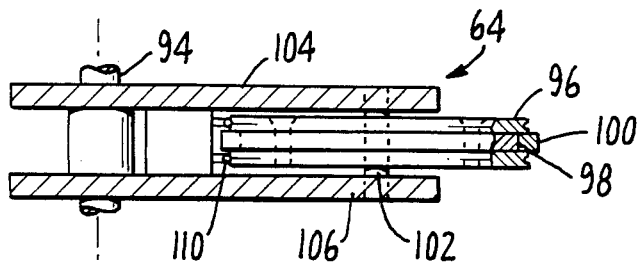
FIG. 7.
FIG. 8.
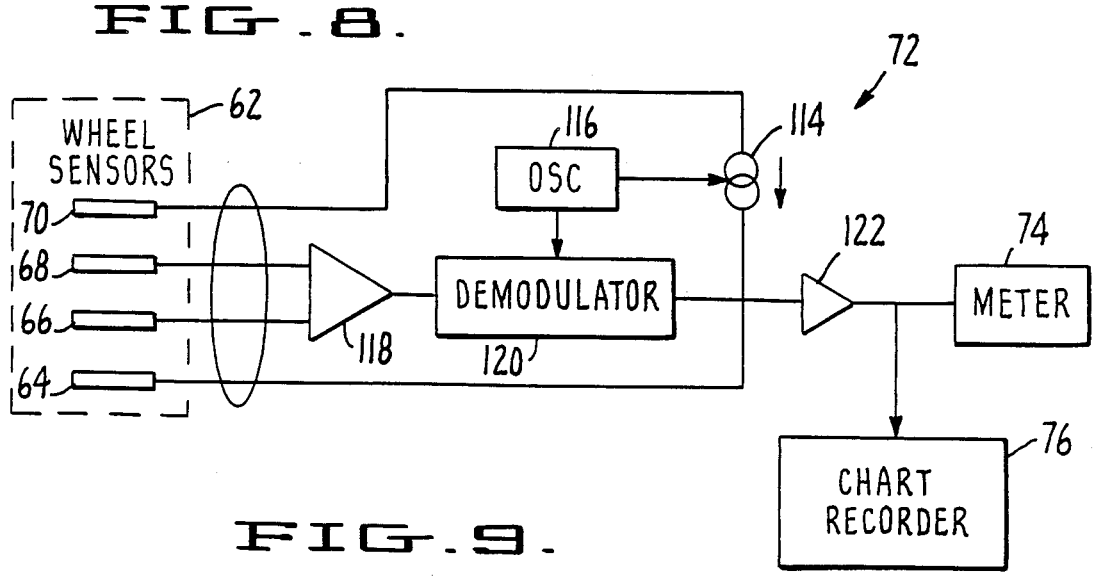
FIG. 9.

APPARATUS FOR OBTAINING TRANSVERSE UNIFORMITY DURING THIN FILM DEPOSITION ON EXTENDED SUBSTRATE

FIELD OF THE INVENTION

This invention relates generally to depositing thin films of material onto a substrate. More particularly, it relates to the deposition by sputtering of a thin film layer onto a long, extended sheet of flexible substrate with sputtering controlled in a plurality of adjacent zones extending laterally across the substrate.

BACKGROUND OF THE INVENTION

Sputtering techniques have been developed for coating long flexible sheets of substrate with thin film deposits of desired metal-based materials. The process requires a cathode, an anode, a gas atmosphere for establishing a gas-discharge plasma, a source of sputtering material, an evacuable chamber to house these items, a power supply, a gas supply, a supply of the substrate to be coated, and apparatus for passing the substrate adjacent the plasma chamber. Such an apparatus which deposits a plurality of layers onto a substrate is described in U.S. Pat. No. 4,298,444, entitled "Method for Multilayer Thin Film Deposition".

The evacuable chamber may be evacuated to a pressure as low as a few millitorr in some systems. An electric field of several hundred volts is established between the cathode and anode to produce glow discharge or plasma. The substrate is positioned within a few inches of the cathode. The cathode is usually formed of the metal to be sputtered and is referred to generally as the target. Ions from the plasma are accelerated toward the cathode by the electric field where they strike and transfer their kinetic energy to atoms of metal, causing them to be ejected as a hot gas. This metal gas condenses on and coats the substrate.

If the sputtering process takes place in an inert gas, such as argon, that does not react with the atoms of the target, the coating deposited on the substrate will remain relatively pure. However, the mixture of a normally reactive gas, such as oxygen or fluorine, with the nonreactive gas changes the composition, and therefore, the characteristics, of the sputtered deposit. A general term which may be used to describe this is $MO_x$, where M represents the metal, O represents oxygen, and the subscript x represents the amount of oxygen which combines with the metal. The electrical properties of the resultant sputtered deposit are often important. As a general rule, where the metal deposited is electrically conductive, the less oxygen that combines with it the more conductive is the deposited coating. Conversely, the more oxygen, the less conductive it is.

Recent uses of thin film coatings on sheets of flexible material have developed in the area of optics, and more specifically, the area of window manufacture to control the frequencies of light which pass through. It is becoming more common to construct such windows with a sheet of a flexible material, such as plastic or polymer. One of the fundamental problems in the manufacture of such sheets is in obtaining consistency in the thickness or other characteristic of the deposited layer(s). Conventionally, a deposition chamber is used with a sensor placed downstream to measure the desired characteristic. Control is then provided by a feedback loop to vary one or more of the input variables. This has resulted in a reasonable consistency along the length of the substrate but did not affect the inconsistencies which resulted across the width of the substrate. It has been found that because of the dynamics of the operation of the plasma chamber, even with attempted uniform construction of the plasma chamber structure along the width of the substrate, there is significant fluctuation of the plasma.

This has been improved by the application of gases to the chamber in individual zones with feedback localized to each zone. This has done much to improve the lateral consistency of the resulting sputtered layer. However, need still exists to provide for more uniform consistency laterally across the substrate.

SUMMARY OF THE INVENTION

The present invention provides apparatus for depositing a sputtered thin film on an extended sheet which has improved consistency. Further, apparatus made according to the invention is relatively easy to manufacture and is durable for a long operating life.

Apparatus made according to the invention for sputter depositing a material onto a traveling substrate in an evacuable sputtering chamber includes a mutually spaced cathode and anode disposed in the chamber which define a plasma region extending along the width of a substrate traveling in the chamber. Further included is an electric power supply for applying a predetermined voltage potential between cathode and anode appropriate for generating a plasma of a predetermined plasma gas. A target disposed relative to the cathode provides the material to be deposited on the substrate. A gas supply supplies the predetermined plasma gas to be used to form a plasma in the plasma region. A duct coupled to the gas supply and having an end extending through the anode with an end opening into the plasma region directs gas received from the gas supply into the plasma region. A magnetic field generator disposed adjacent the plasma region provides a magnet field in the plasma region for controlling the shape of the plasma generated.

In an apparatus made according to the invention, the duct may have a plurality of ends opening into the plasma region, which ends are generally equally spaced along the anode for directing gas received from the gas supply into the plasma region along the width of a traveling substrate. Additionally, the duct includes a distribution chamber extending along the length of the anode and having an outlet corresponding to and communicating with each duct end, and a gas supply inlet for each pair of adjacent outlets. The gas supply inlets are disposed in the distribution chamber at generally equally spaced positions between the associated pairs of adjacent outlets.

It will be seen that such a sputtering apparatus provides a plasma during sputtering with a substantially uniform plasma distribution along the length of the plasma region. Further, it is relatively easy to manufacture and use. These and other features and advantages of the present invention will become apparent from a consideration of the drawings and the following detailed description of the preferred embodiment.

BRIEF DESCRIPTION OF THE DRAWINGS

FIG. 1 is a fragmentary perspective view of the sputtering chamber and sensor apparatus made according to the present invention relative to a traveling substrate.

FIG. 2 is a cross sectional view of an anode used in the sputtering chamber taken along line 2—2 in FIG. 1.

FIG. 6 is a perspective view of the sensor apparatus of FIG. 1.

FIG. 7 is a partial side view of the apparatus of FIG. 6.

FIG. 8 is a cross sectional view taken along line 8—8 of FIG. 7.

FIG. 9 is a block diagram of the sensor interface circuit of FIG. 1.

DETAILED DESCRIPTION OF THE PREFERRED EMBODIMENT

Figure 3:
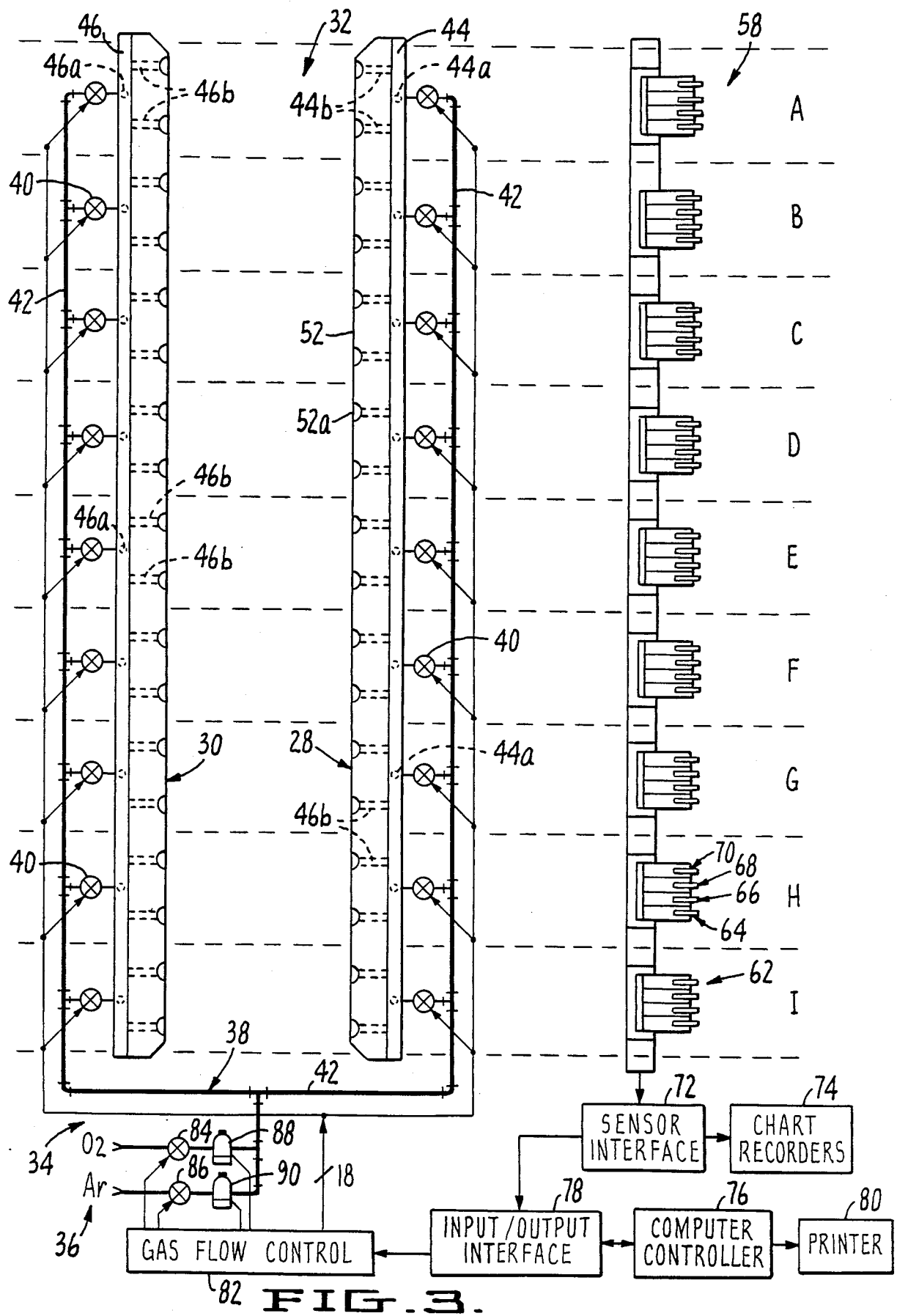
FIG. 3 is a plan view of the sputtering chamber and sensor apparatus shown in FIG. 1 with the control system shown in block diagram form.
Figure 4:
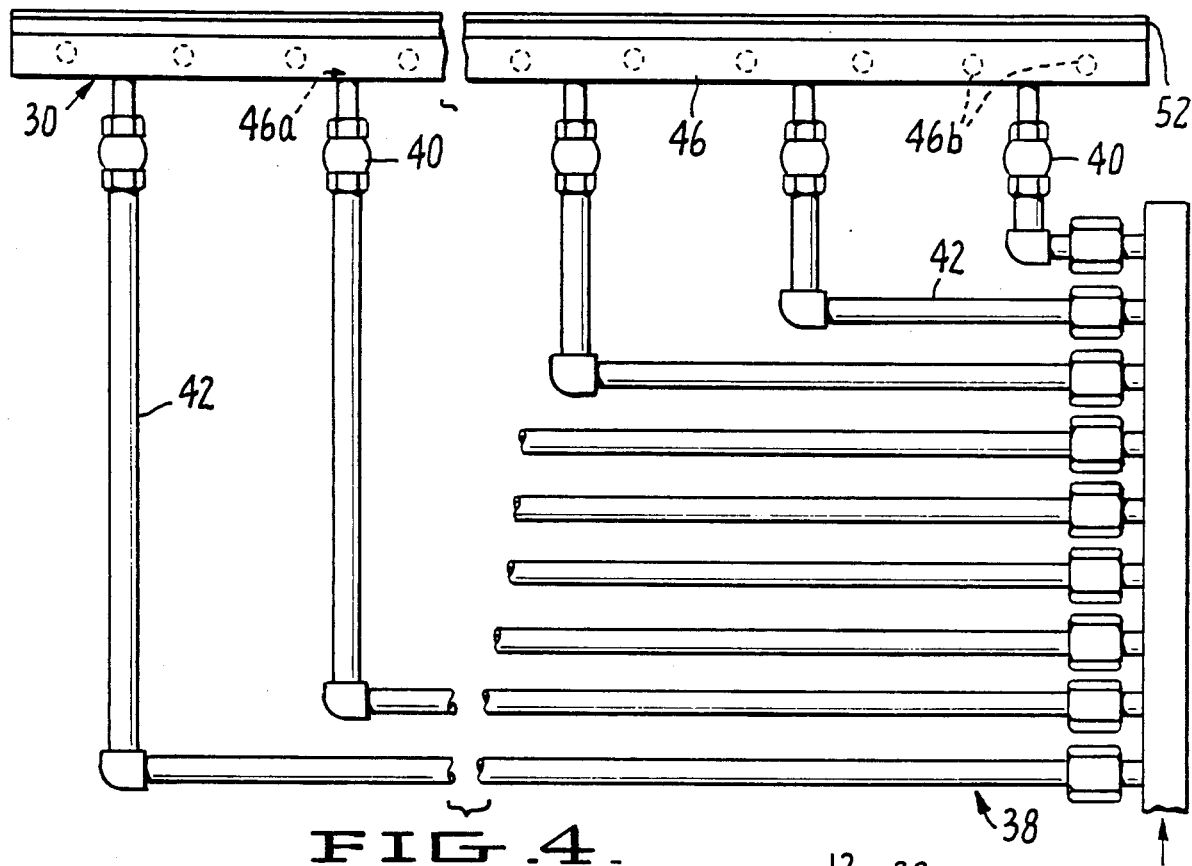
FIG. 4 is a side view of a gas duct system used with the apparatus shown in FIG. 1.

The preferred embodiment of the present invention is directed toward the sputtering of a metal-based compound on a sheet of flexible plastic substrate. The measured characteristic of the sputtered layer is electrical resistance. It will be understood that other embodiments of the present invention may be used.

The deposition or sputtering chamber and sensor apparatus to be described is disposed in an evacuated chamber. A suitable power supply and connections, cooling system, substrate play-out and take-up rolls, substrate support and driver, and related apparatus are provided as is conventionally known, such as is described in the previously referenced U.S. Pat. No. 4,298,444. In order to simplify the illustrations and description, these aspects of an operating system are omitted.

Referring initially to FIG. 1, shown generally at 10 is a thin-film deposition apparatus made according to the present invention. Apparatus 10 is shown relative to a sheet 12 of a suitable flexible substrate, such as a polymer having the trademark Kapton, sold by Dupont and having a thickness of about 3 mm and a width of 54 inches (1.35 m). During operation, sheet 12 is carried from left to right as viewed in the figure and shown by the arrow at a rate of about 20 mm/sec. Sheet 12 is supported on and carried by a support cylinder not shown.

Extending across the width of sheet 12 is a deposition station 14. The structure of the deposition station is also illustrated in FIGS. 2-5. Included is a cathode assembly 16. Assembly 16 includes a frame 18 mounted to a housing 20 by insulating connectors 21. As particularly shown in FIG. 5, a plate target 22 serves as the cathode with the plasma being controlled by a magnet 24 which extends in a long oval loop having parallel sides extending beyond the width of substrate sheet 12. A corresponding oval track 26 is formed in target 22 as the metal of which the target is made is removed and deposited on the substrate. In the preferred embodiment, target 22 is made of nichrome, an alloy composed of 80% nickel and 20% chromium and which has a resistance of 33 ohms/square.

Figure 5:
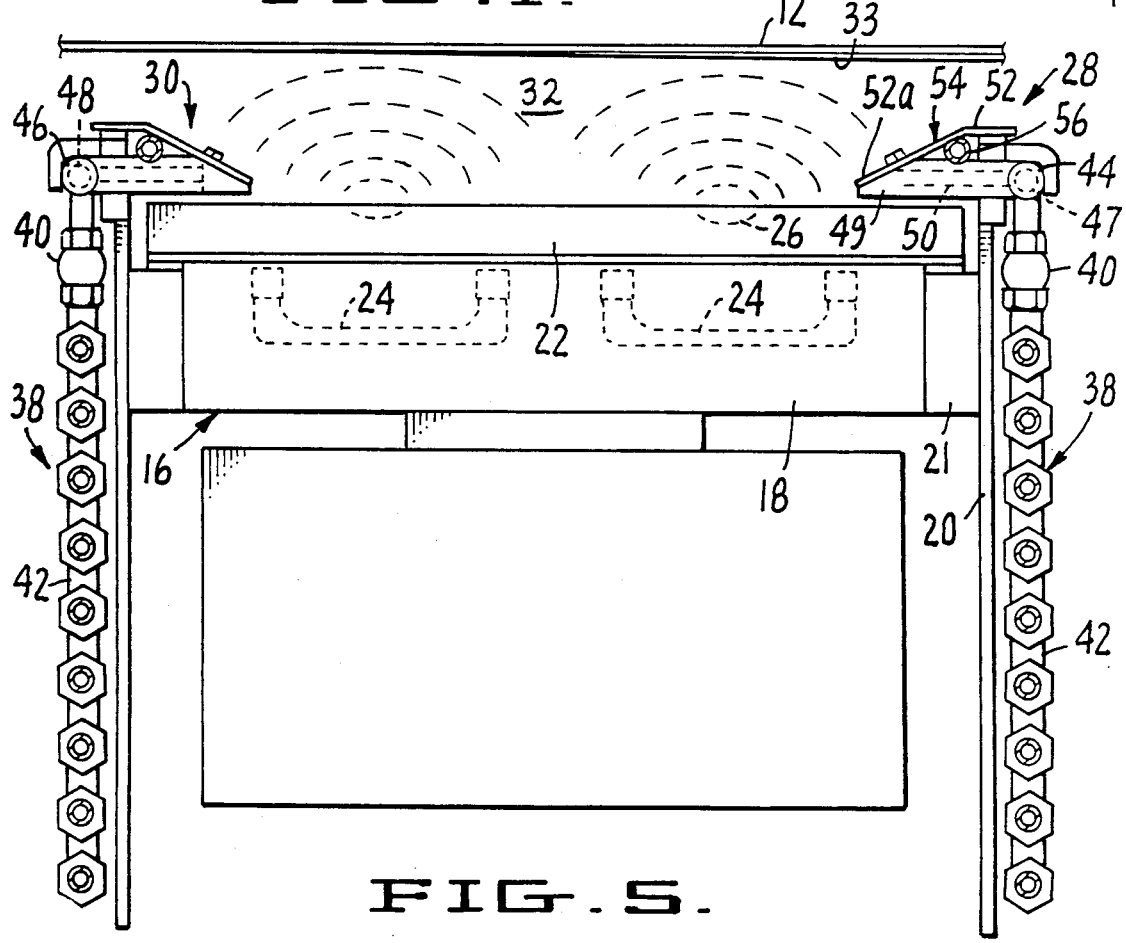
FIG. 5 is an end view of the sputtering chamber and associated apparatus of FIG. 1.

A pair of oppositely spaced and parallel anodes 28 and 30 are disposed above and along the edges of target 22. They are parallel to the parallel sides of the magnet loop and coextensive with it so that plasma is generated in the loop previously described. This region between the cathode and the anodes is referred to as a sputtering or deposition region 32. A thin film 33 formed of metal oxides from the target is deposited on sheet 12 as it travels from left to right through the deposition region as is illustrated in FIG. 5.

A gas supply system 34 provides a selected mixture of gases (oxygen and argon) to the deposition region formed between target 22 and sheet 12. The pressure of the sputtering chamber is preferably maintained at about 0.003 torr. System 34 includes a gas supply 36 which provides the selected gases. In this embodiment, supply 36 actually includes separate sources of both oxygen and argon with the oxygen being mixed into the argon so that the combined gas delivered to the deposition chamber is about one sixth oxygen. Two 32 inch diffusion pumps have been found to adequately maintain the desired gas flows.

As can be seen particularly in FIG. 1, the gas is supplied to nine adjacent zones distributed across the face of sheet 12. These zones are indicated by the letters A-I shown in the FIG. 3. The outer margin zones extend beyond the edge of the edge of the sheet to assure uniform control of the sputtering process over the entire sheet width. The gas is supplied to the corresponding portion of the deposition chamber by a duct system 38 and is individually controlled. That is, controllable valves 40 and gas-conducting conduit or pipe 42 carries the gas from the source to the deposition chamber.

All the pipe portions on each side of the deposition chamber connect with gas manifold tubes 44 and 46 at inlets 44a and 46a. These tubes define distribution chambers 47 and 48, respectively, which extend the length of the respective anodes 28 and 30. Opposite each inlet 44a and 44b are a pair of outlets 44b and 46b, respectively. These outlets are equally spaced along the inside edge of tubes 44 and 46 and each inlet is centered between and opposite from the corresponding pair of outlets.

Each pair of associated outlets correspond to one of the designated zones. In the preferred embodiment, each zone is approximately seven inches wide. This has been found to be a structure which provides substantial independent control of each pair of outlets while providing for dynamic interaction between adjacent pairs of holes so that any inconsistencies between adjacent pairs tend to be smoothed. Thus, a smooth transition exists between zones as defined by the outlet pairs.

Anodes 28 and 30 are built the same. The following discussion with respect to anode 28 will also apply to anode 30. The anode has an anode body 49 which is in the form of a thick plate extending the length of the anode. It includes a bore 50 corresponding to each tube outlet 44b. The bores extend parallel with the face of the cathode or target 22 and open toward deposition region 32. Disposed in each bore 50 is a liner tube 51 which is directly connected to tube 44 with the tube outlets in alignment and communication with the corresponding liner tube passageways.

A cover plate 52 is disposed on top of anode body 49 to define a cavity 54 in which is disposed a cooling tube 56 connected to a conventional cooling system for cooling the anode. Plate 52 has a series of cutouts 52a disposed along the edge close to deposition region 32. These cutouts correspond with the openings of bores 50 to allow the gas mixture to be dispelled directly into the deposition region during sputtering.

Referring again to FIGS. 1 and 3, downstream from deposition station 14 is a sensing station 58. Station 58 includes a frame 60 which is fixedly mounted to allow passage of sheet 12 adjacent it. Extending from and supported by frame 60 are a plurality of sensor assemblies 62, one positioned adjacent each of the zones A–I. Each sensor assembly supports four equally spaced wheel assemblies 64, 66, 68 and 70. Each sensor assembly generates a signal, as will be explained, indicative of the resistance of the sputtered layer on sheet 12. These signals are fed to a sensor interface 72 which outputs a reading on a suitable output device, such as strip chart recorders 74. The signal is also fed to a computer controller 76 through an input/output interface unit 78, such as the commercially available MUMAC 4000, used for converting of the analog data to digital form. The computer performs calculations based on desired resistance and generates an output to a printer 80 as well as a control signal through interface unit 78 to a gas flow control unit 82. This gas control unit may be of any suitable type, such as the MKS type 246 electronic box and 1259 flow meter with valve produced by MKS Instruments, Inc. of Andover, Mass.

Control unit 82 outputs control signals to each of valves 40 as well as to individual oxygen and argon supply valves 84 and 86. The gas flow from valves 84 and 86 is measured by sensors 88 and 90 which provide feedback based on a desired set point to computer controller 76.

Sensor assembly 62 is shown in perspective in FIG. 6. The wheel assemblies are substantially similar with side and cross-sectional views of assembly 64 shown in FIGS. 7 and 8 being exemplary. The four wheel assemblies in each sensor assembly 62 are supported on frame 60 to pivot about a pivot axis 92 on a pin 94. Each wheel assembly includes a wheel 96 having a circumferential groove 98 in which is disposed an electrically conductive rubber tire 100 which contacts the substrate and film. The tire may be made of a suitable material such as silicone rubber graphite. The wheel is preferably made of a highly conductive material such as copper. The wheels are mounted on an axle 102 between a pair of mounting plates 104 and 106, as shown.

An electrical terminal 108 is mounted between plates 104 and 106. Extending in a spring-biased manner against the rim of wheel 96 is a silver armature contactor or brush 110. A conductor 112 extends from the terminal to sensor interface 72.

The electrical circuit in which the wheel assemblies are constructed is shown in FIG. 9. As can be seen, the two outside wheels are connected to a current source 114 which is controlled by an internal oscillator 116. These wheels establish a current passing through the deposited film passed the two inner wheel assemblies. The two inner wheels are then used to measure the voltage between them. For this purpose, they are connected to a differential amplifier 118, the output of which is connected to a demodulator 120 using the drive frequency of oscillator 116. The output is then fed to an operational amplifier 122 and to the output meter 74 and chart recorder 76.

The resistance is directly proportional to the ratio of the voltage sensed by the two inner wheel assemblies and the current produced in the film by the two outer wheel assemblies. The current is in the form of a square wave having a frequency between 400 Hz and 600 Hz, with the actual frequency varying between the sensor units at 50 Hz intervals. The resultant square wave voltage is synchronously demodulated and amplified by a gain corresponding to the system and film in order to produce a signal indicative of the resistance.

Figure 10A:
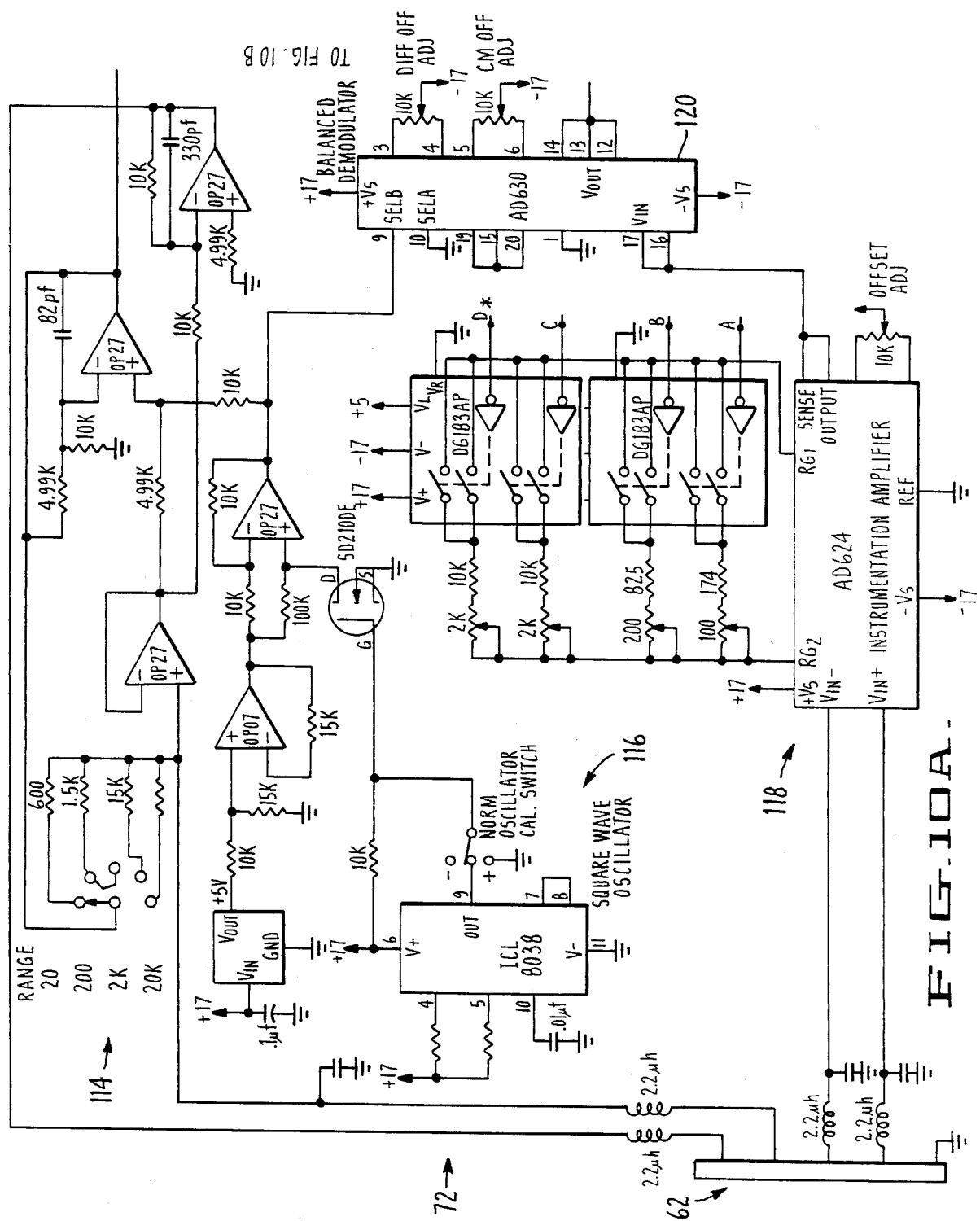
FIGS. 10A and 10B form the schematic of the sensor interface circuit of FIG. 9.
Figure 10B:
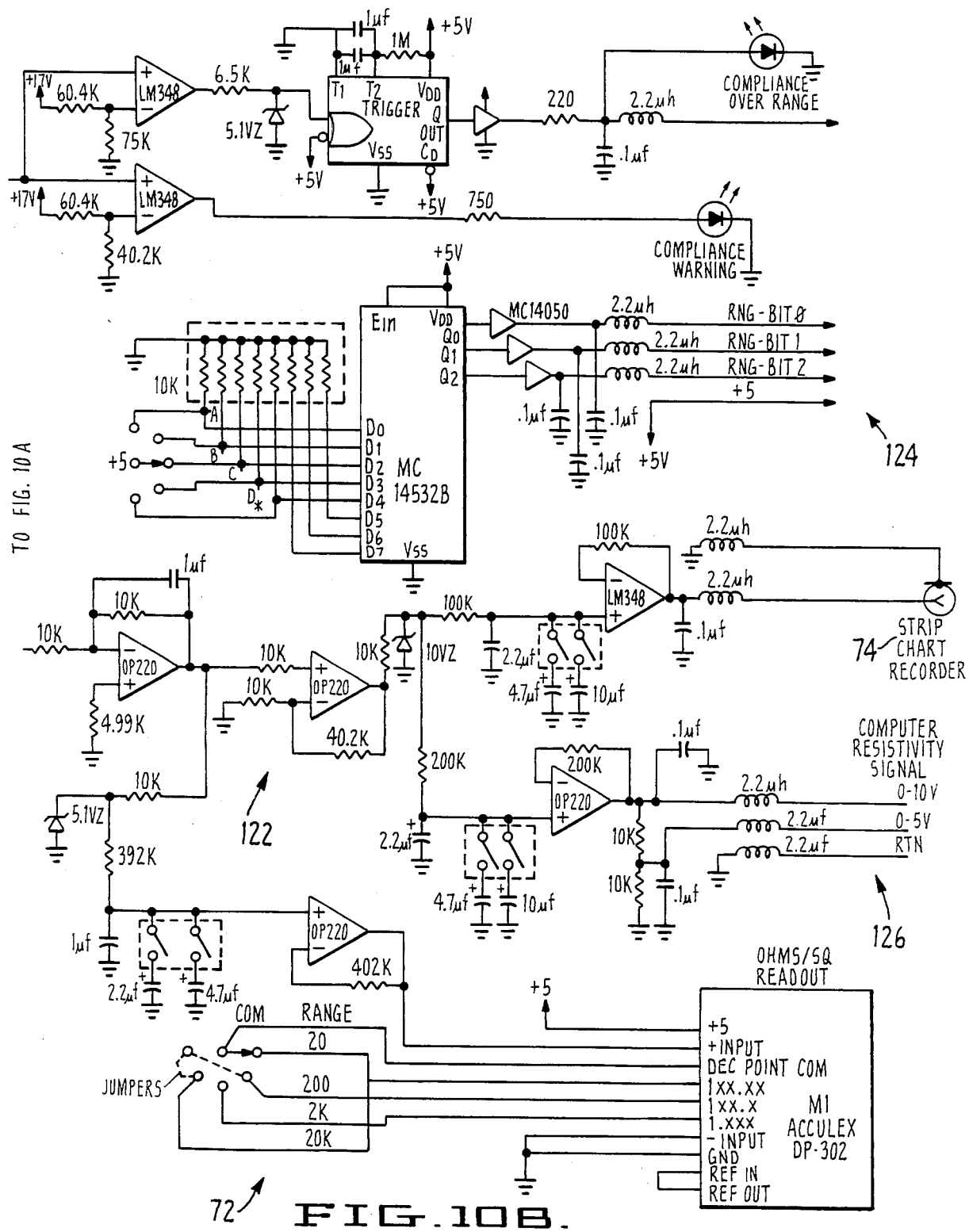

The detailed schematic for sensor interface 72 is provided in FIGS. 10A and 10B. This circuit is relatively straightforward with details of construction being provided in the figures. The general functional circuit components discussed with reference to FIG. 9 are shown. In addition, there are some circuit monitoring systems 124 shown in FIG. 10B. These are used to check the overall operating characteristics to see that they stay within a predetermined compliance range. The output of this circuit, shown generally at 126 provides the resistivity signals for use in the computer controller.

Figure 11:
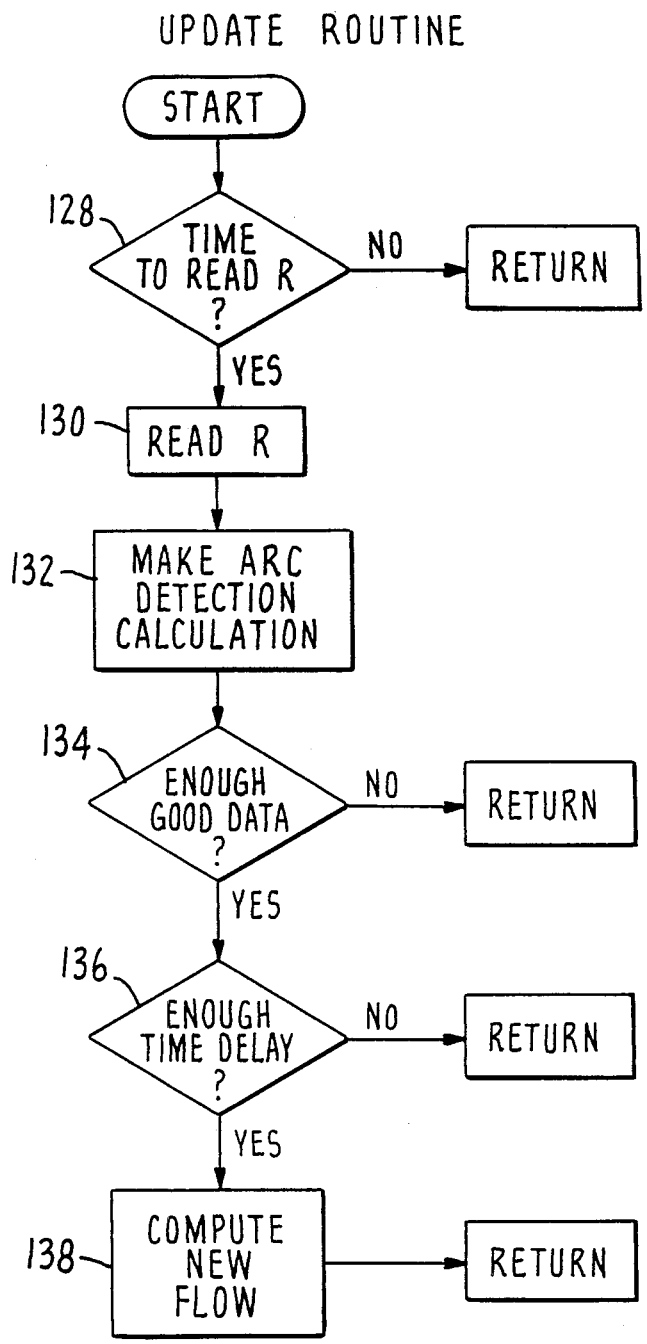
FIG. 11 is a flow chart of the gas flow update routine of the control system of FIG. 3.

Although the operation of computer controller 76 uses basic control software such as is generally known in the field, the update routine used to update the calculation of film thickness as represented by the resistances across the film is adapted to the operating characteristics of the environment in which this system operates. This subroutine is not absolutely required, but does provide for more consistent system operation. This subroutine is shown in flow chart form in FIG. 11.

Arcing has been found to occasionally occur in the sputtering source which produces a spike in the sensor signal. In order to compensate for this occurrence, readings are taken periodically and checked to see if they are within an expected normal operating range. If so, the data is assumed to be valid. If not, it is assumed to be invalid. Only when a predetermined accumulation of valid data is received is a calculation made of the resistance of the deposited film. The Update Routine provides this checking.

After the system operation is initiated and the gas flows, resistances are defined and timing is established, a determination is made as shown in block 128 as to whether it is time to read R, the resistances as sensed by the roller or wheel sensors. Readings are preferably made at predetermined intervals to allow enough travel of the deposited film passed the wheel sensors between readings.

If it is not time, the system returns to the main program. If it is time, the resistance reading is read at block 130. The arc detection calculation mentioned above is made at block 132 to determine if the data is a valid reading of resistance. If it is valid data it is added to the set of valid data accumulated and a determination made as to whether enough data is present at block 134. It is preferred that about ten readings be accumulated and a weighted average computed, rather than taking each reading at face value for control purposes.

If there is not enough good data, the program returns. Otherwise, a check is made to see if there has been enough time delay at block 136. Readings are only made periodically rather than as fast as the computer operates, because there is a delay in the deposited film traveling from the deposition region to the rollers. It is preferable to measure the resistance in response to a change in gas flow control only after the changed film appears at the sensor wheels.

If enough time has not elapsed, the program returns. If sufficient time has elapsed, a new flow is computed at block 138 based on a weighted average of the accumulated data and a corresponding control signal sent to gas flow control unit 82.

During a typical operation, sheet 12 is made to travel through deposition region 32 at the rate of 21 mm/sec. Approximately 500 volts is applied between the anode and cathode when only argon gas is being used, and about 550 volts when oxygen is also present. A current flow of about 30 amps is produced. The argon flows at about 100 to 120 SCCM/zone (SCCM is standard cubic centimeters per minute). The oxygen flow is varied to produce resistances typically in the range of 100 to 1000 ohms per square. For a resistance of 350 ohms per square approximately 20 to 25 SCCM/zone is applied.

The gases flowing into distribution chambers 47 and 48 tend to provide smooth transitions between adjacent zones, since a single distribution chamber is used to feed all of the zones. By centering the inlet port for each zone between the two outlet ports, control of each zone is achieved. However, a significant control change in one zone will overlap into adjacent zones. This produces a system control which provides substantially uniform film deposition both longitudinally and laterally on the sheet.

Further, by having the distribution chambers coupled directly to the passageways through the anode, gases are expelled directly into the electric field surrounding the anodes. This produces a very stable plasma and one that more efficiently uses the plasma gases as compared to conventional systems which direct the gases around the anode or cathode.

Although the invention has been particularly described with reference to the foregoing preferred embodiment, it will be apparent to those skilled in the art that variations in form and detail may be made without departing from the spirit and scope of the invention as defined in the claims.

I claim:

1. Apparatus for sputter depositing a material onto a traveling substrate in an evacuable sputtering chamber comprising:
   a cathode disposed in the chamber;
   an anode disposed in the chamber and spaced from said cathode, said anode and cathode defining a plasma region extending along the width of a substrate traveling in the chamber;
   an electric power supply for applying a predetermined voltage potential between said cathode and anode appropriate for generating a plasma of a predetermined plasma gas;
   a target disposed relative to said cathode for providing the material to be deposited on the substrate;
   a gas supply for supplying the predetermined plasma gas to be used to form a plasma in said plasma region;
   duct means coupled to said gas supply and having an end extending through said anode with an end opening into said plasma region for directing gas received from said gas supply into said plasma region; and
   magnetic field means disposed adjacent said plasma region for providing a magnetic field in the plasma region for controlling the shape of the plasma generated.

2. An apparatus according to claim 1 wherein said anode is formed at least partially of a solid material, and said duct means includes a bore extending through the solid material portion of said anode and conduit means extending from said gas supply to said bore.

3. An apparatus according to claim 2 further comprising a plurality of said duct means end distributed along said anode, said duct means further comprising means defining a distribution chamber extending along the length of said anode and disposed adjacent to said anode and having an outlet corresponding to each duct means end, each of said outlets being coupled to the corresponding one of said duct means openings.

4. An apparatus according to claim 3 wherein said distribution chamber has a gas supply inlet for each pair of adjacent outlets and said duct means ends are equally spaced, said gas supply inlets being disposed in said distribution chamber at generally equally spaced positions between the associated pairs of adjacent outlets.

5. An apparatus according to claim 4 wherein said conduit means includes a gas supply line connected to each distribution chamber inlet, said apparatus further including means for controlling the flow of gas in each of said gas supply lines.

6. An apparatus according to claim 5 further comprising a means associated with each distribution chamber inlet for sensing a predetermined characteristic of the layer deposited on a traveling substrate, which characteristic varies as a function of the gas supplied to the plasma region, each said controlling means being responsive to said associated sensing means for controlling the flow of gas in said associated gas supply line for maintaining the sensed characteristic at a predetermined value.

7. An apparatus according to claim 1 wherein said anode includes a generally planar surface facing said cathode and the longitudinal axis of said duct means end extends generally parallel with said planar surface.

8. Apparatus for sputter depositing a material onto a traveling substrate in an evacuable sputtering chamber comprising:
   a cathode disposed in the chamber;
   an anode disposed in the chamber and spaced from said cathode, said anode and cathode defining a plasma region extending along the width of a substrate traveling in the chamber;
   an electric power supply for applying a predetermined voltage potential between said cathode and anode appropriate for generating a plasma of a predetermined plasma gas;
   a target disposed relative to said cathode for providing the material to be deposited on the substrate;
   a gas supply for supplying the predetermined plasma gas to be used to form a plasma in said plasma region;
   duct means coupled to said gas supply and having a plurality of ends opening into said plasma region and being generally equally spaced along said anode for directing gas received from said gas supply into said plasma region along the width of a traveling substrate, said duct means further comprising means defining a distribution chamber extending along the length of said anode and having an outlet corresponding to and communicating with each duct means end, and a gas supply inlet for each pair of adjacent outlets, said gas supply inlets being disposed in said distribution chamber at generally equally spaced positions between the associated pairs of adjacent outlets; and
   magnetic field means disposed adjacent said plasma region for providing a magnetic field in the plasma region for controlling the shape of the plasma generated.

9. An apparatus according to claim 8 wherein said duct means further comprises a gas supply line connected to each distribution chamber inlet, said apparatus further comprising means for controlling the flow of gas in each of said gas supply lines.

10. An apparatus according to claim 9 further comprising means associated with each distribution chamber inlet for sensing a predetermined characteristic of the layer deposited on a traveling substrate, which characteristic varies as a function of the gas supplied to the plasma region, each said controlling means being responsive to said associated sensing means for controlling the flow of gas in said associated gas supply line for maintaining the sensed characteristic at a predetermined value.

11. An apparatus according to claim 8 wherein said distribution chamber has a substantially uniform cross section along the length corresponding to the width of a traveling substrate.

* * * * *